USOO5825792A

United States Patent [19]
Villeneuve et al.

[11] Patent Number: 5,825,792
[45] Date of Patent: Oct. 20, 1998

[54] WAVELENGTH MONITORING AND CONTROL ASSEMBLY FOR WDM OPTICAL TRANSMISSION SYSTEMS

[75] Inventors: Bernard Villeneuve, Aylmer; Hyung B. Kim, Kanata, both of Canada

[73] Assignee: Northern Telecom Limited, Montreal, Canada

[21] Appl. No.: 680,284

[22] Filed: Jul. 11, 1996

[51] Int. Cl.$^6$ .................................................... H01S 3/13
[52] U.S. Cl. ................................................ 372/32; 372/28
[58] Field of Search .................................. 372/9, 20, 23, 372/24, 28, 29, 32, 33, 38

[56] References Cited

U.S. PATENT DOCUMENTS

| | | | |
|---|---|---|---|
| 4,309,671 | 1/1982 | Malyon | 372/31 |
| 4,839,614 | 6/1989 | Hill et al. | 359/238 |
| 4,914,662 | 4/1990 | Nakatami et al. | 372/32 |
| 5,003,546 | 3/1991 | Lidgard et al. | 372/29 X |
| 5,200,967 | 4/1993 | Miyata et al. | 372/32 |
| 5,243,614 | 9/1993 | Wakata et al. | 372/29 |
| 5,331,651 | 7/1994 | Becker et al. | 372/32 |
| 5,394,418 | 2/1995 | Shiozawa | 372/38 |
| 5,438,579 | 8/1995 | Eda et al. | 372/34 |

FOREIGN PATENT DOCUMENTS

| | | | |
|---|---|---|---|
| 0 091 068 A1 | 3/1983 | European Pat. Off. | G02B 27/10 |
| 0 341 315 A1 | 10/1988 | European Pat. Off. | H01S 3/137 |
| 0 516 318 A2 | 5/1992 | European Pat. Off. | G11B 7/125 |
| 92-157780 | 5/1992 | Japan | H01S 3/133 |

OTHER PUBLICATIONS

Patent Abstracts of Japan, vol. 009, No. 274 (E–354), 31 Oct. 1985 & JP 60 117695 A (Sharp KK), 25 Jun. 1985, Abstract.

Patent Abstracts of Japan, vol. 016, No. 447 (E–1266), 17 Sep. 1992 & JP 04 157780 A (Fujitsu Ltd.), 29 May 1992, Abstract.

N. Karlovac, et al,Accuwave Product Specification entitled "Laser Wavelength Control with Crystal Bragg Gratings", 10 pp., No Date.

*Primary Examiner*—John D. Lee
*Attorney, Agent, or Firm*—Angela C. de Wilton

[57] ABSTRACT

A compact wavelength monitoring and control assembly for a laser emission source is provided comprising a narrow bandpass, wavelength selective transmission filter element, of Fabry-Perot etalon structure, through which a non-collimated beam from the laser source is directed onto two closely spaced photodetectors. For wavelength stabilization, the differential output of the two photodetectors is used in a feedback loop to stabilize the wavelength of the laser source to a desired target wavelength. Through the angular dependence of the wavelength transmission of the Fabry-Perot etalon, a wavelength variation from the source is converted to a transmission loss, which is different for the two photodetectors, so that the wavelength change is detected as a differential power change. The device functions as an optical wavelength discriminator in which the detector converts optical energy to current for a feedback loop for controlling the light source. A lens may be used to control the divergence of the light incident on the filter element to optimize power transfer. Optionally, wavelength tunability is provided by changing the angle of inclination of the Fabry-Perot etalon relative to the laser source. The system is compact and may be co-packaged within the same package as a laser emission source, overcoming coupling, space and power dissipation problems common with known external semiconductor laser wavelength control units.

19 Claims, 2 Drawing Sheets

WAVELENGTH MONITORING AND CONTROL ASSEMBLY FOR WDM OPTICAL TRANSMISSION SYSTEMS

FIELD OF THE INVENTION

This invention relates to a wavelength monitoring assembly for providing a control signal for wavelength stabilization of a laser source, with application for WDM optical transmission systems.

BACKGROUND OF THE INVENTION

Optical fiber communication systems provide for low loss and very high information carrying capacity. In practice, the bandwidth of optical fiber may be utilized by transmitting many distinct channels simultaneously using different carrier wavelengths. The associated technology is called wavelength division multiplexing (WDM). In a narrow band WDM system 8, 16 or more different wavelengths are closely spaced to increase fiber transmission capacity.

The wavelength bandwidth that any individual channel occupies depends on a number of factors, including the impressed information bandwidth, and margins to accommodate for carrier frequency drift, carrier frequency uncertainty, and to reduce possible inter-channel cross-talk due to non-ideal filters.

To maximize the number of channels, lasers with stable and precise wavelength control are required to provide narrowly spaced, multiple wavelengths.

Some laser sources, for example distributed feedback (DFB) lasers, exhibit wavelength drift over time, in excess of the requirements for narrow band WDM. The wavelength of the device tends to change with aging under continuous power. Since telecommunication systems are expected to have a lifetime of the order of 25 years, wavelength control must be added to the laser transmitter to ensure minimum cross-talk between narrowly spaced channels over extended time periods.

Single wavelength optical communications systems are widely used in the industry. Ideally, systems designers seek minimum disruption of existing systems and compatibility with existing packaging in development of WDM systems.

Typically, known laser wavelength monitoring and stabilization systems are based on a unit external to the standard package of a laser source (transmitter). One commercially available system for monitoring and control of the wavelength of a semiconductor laser is an assembly based on crystal gratings. For example, in a known system manufactured by Accuwave, and described in the product literature, a wavelength locker unit is provided which comprises a lithium niobate crystal in which two Bragg gratings are written, illuminated by a collimated beam from a laser source coupled to the assembly, and two photodetectors. Each grating has a slightly different Bragg wavelength and angle relative to the input beam. The output reflected from the gratings is directed to the two detectors and the differential output is used to provide feedback control to the laser. Wavelength stability of better than 10 pm can be achieved with the control loop. However, the locker utilizes a separate unit from the transmitter, and thus requires external coupling to the laser or light source. Moreover, the unit is designed for a specific wavelength, as specified by the grating parameters. Different units are required for different wavelengths.

Another known type of wavelength monitoring/control assembly is based on a fiber grating. For example, copending GB Patent Application No. 96/00478 filed Mar. 4, 1996 to Epworth et al., relates to an external cavity type laser whose external reflector is provided by a Bragg reflector located in an optical fibre butted to an anti-reflection coated facet of the semiconductor laser. The grating is placed far enough from the laser that the longitudinal modes are so closely spaced that the laser operates multimode with so many modes as to make mode partition noise negligible. Another copending GB Patent Application No. 95/19614.3, filed Sep. 26, 1995 to Epworth et al., relates to using a chirped fiber grating for equalization and laser frequency stabilization.

Fabrication of fiber grating assemblies is complex. As with the crystal grating system mentioned above, fibre gratings are fabricated to match the specific wavelength of the transmitter, and the assembly is therefore wavelength specific.

Another system for stabilization of a semiconductor laser is described in U.S. Pat. No. 4,309,671 to Malyon which uses a pair of matched photodiodes and two beam splitters. The first beam splitter and first photodiode monitor power, and a second beam splitter, a frequency dependent filter and second photodiode are used to monitor wavelength changes. The outputs of the matched photodiodes are fed via amplifiers to a subtractor amplifier and the output is fed as negative feedback to the amplifier controlling operation of the laser.

Other known systems are based on a filter element such as a Fabry-Perot etalon. For example, U.S. Pat. No. 5,331,651 to Becker et al. describes the use of a Fabry-Perot etalon for fine tuning in conjunction with a grating for coarse tuning of the output of a laser.

In a system described in U.S. Pat. No. 5,438,579 to Eda et al., a Fabry-Perot etalon is used with a single photodetector to generate a signal used to lock onto one peak of a semiconductor laser, requiring collimated beams. Hill et al., in U.S. Pat. No. 4,839,614 describe a system for referencing frequencies of radiation from multiple sources relative to a reference source, using a filter element such as a Fabry-Perot etalon and a corresponding plurality of detectors.

Another system for laser wavelength stabilization is described in U.S. Pat. No. 4,914,662 to Nakatani et al. which involves spectroscopically processing the output of a variable wavelength laser and measuring a spatial distribution using image processing apparatus, and then comparing the distribution to that of a reference light source of fixed wavelength. The latter image processing system is complex, and not readily compatible with providing a low cost, compact unit.

Japanese Patent Application 92-157780 relates to a frequency stabilizer for semiconductor laser, without using external modulating means, and is based on an inclined Fabry-Perot etalon on which the laser source is incident, and two photo-detectors to detect respectively the transmitted and reflected signals. By subtracting outputs of the two detectors, a signal is provided for controlling the oscillation frequency. Resonator length is altered by changing the inclination of the etalon to allow for tunability. The implementation of this system for minimum space requires using the FP at a relatively large angle, with decreased stability in terms of center wavelength and bandwidth. On the other hand, a small FP angle requires added components and space, as shown in FIG. 1B of this patent application. Also, independent detectors are used, with potentially different response and aging characteristics.

Consequently, various existing systems for wavelength stabilization are known using a crystal grating, fiber grating or etalon based arrangement. The grating based systems lack wavelength tunability and many systems are based on relatively large control units external to a packaged laser source, with concurrent coupling, space and power dissipation problems. While etalon based systems provide tunability, none of the known configurations are sufficiently compact to incorporate in known standard packages without disruption.

SUMMARY OF THE INVENTION

The present invention seeks to provide a compact wavelength monitoring and control assembly, preferably for integration within a small semiconductor laser package and for application in WDM optical transmission systems.

Thus according to one aspect of the present invention there is provided a wavelength monitoring and control assembly for an optical system comprising a divergent laser emission source, the assembly comprising:

first and second photodetectors spaced apart by a specific separation, and located at a specific distance from the emission source;

a narrow bandpass wavelength selective transmission filter element of Fabry-Perot structure located between the source and the detectors, the filter being tilted at an angle θ relative to the optical axis of the emission source to provide an angular dependence of the wavelength transmission of filter;

and a control loop for feedback of a difference signal generated by the first and second photodetectors in response to a change in wavelength of the emission source to control means of the emission source.

Thus a simple and compact wavelength monitoring and control assembly for a laser emission source is provided. The photodetectors are illuminated through the tilted narrowband pass filter with a slightly diverging beam. Thus, wavelength variation of the laser emission source is converted into differential photocurrent changes in the two photodetectors. The wavelength of the input beam is monitored by the relative responses of the two detectors. The differential output signal of the two detectors is used in a feedback loop to stabilize the wavelength of the source to a desired target wavelength, i.e. through a signal sent back to the laser (transmitter), e.g. via active area temperature changes, or current changes, to correct for wavelength drift.

This assembly allows for precise optical monitoring of the wavelength to provide a control signal for wavelength stabilization, to maintain the laser wavelength within the limits required to reduce cross-talk for use in, for example, a WDM optical transmission system. A difference signal is advantageous also to provide immunity to fluctuations in output power.

The narrow bandpass wavelength selective transmission filter element is required to be a Fabry-Perot structure. The photodetectors are preferably a matched pair of photodiodes. Through the angular dependence of the wavelength transmission of the Fabry-Perot etalon, a wavelength variation from the source is converted to a transmission loss, and the wavelength change is detected as a power change. Thus, the device functions as an optical wavelength discriminator in which the detector converts optical energy to current for a feedback loop for controlling the light source. For wavelength stabilization, the differential output of the two photodetectors is used in a feedback loop to stabilize the wavelength of the laser source to a desired target wavelength.

Beneficially, the angle of inclination of the filter is adjustable to provide tunability of the predetermined wavelength.

Since the wavelength selective filter element is a Fabry-Perot etalon, whose transmission characteristics are dependent on the angle of the etalon relative to the beam, the assembly provides for tunability by adjusting the angle of the etalon. Also, the multiple transmission peaks of an etalon with, for example, 4 nm spacing, can be used for multiple wavelengths. That is, simultaneous stabilization points are attainable for a plurality of predetermined wavelengths determined by wavelength spacings of the multiple transmissive peaks characteristic of the Fabry-Perot filter.

The assembly is simple to manufacture relative to fabrication of fiber grating systems for wavelength stabilization. This approach provides a dither free discrimination scheme, which also avoids frequency modulation and demodulation steps.

Advantageously, the photodetectors are a matched pair of photodiodes. When the gain of each of the two photodetectors is independently adjustable, the predetermined wavelength may be selected by setting unequal gains for the two photodetectors.

Optionally, a lens is disposed between the emission source and the transmission filter element to control divergence of the laser emission source. The divergence of the beam is controlled to optimize performance and power detection. A larger spot size is preferable to provide a more ideal filter shape to obtain more efficient power transfer.

The laser emission source may be an output facet of semiconductor laser, or alternatively a cleaved or tapered single mode fibre.

Advantageously, when the laser emission source comprises a semiconductor laser provided within a package, the wavelength monitoring assembly is provided within the same package to provide an integral unit. While use of the assembly as an external reference unit is feasible, polarization maintaining fibers and couplers are ideally required to avoid polarization dependence.

Thus, according to another aspect of the present invention there is provided a wavelength monitoring and control assembly for wavelength stabilization of a laser emission source comprising, the assembly comprising:

a package, and integrated within the package:

a source of divergent laser emission;

first and second coplanar photodetectors having a specific diameter and separation, and located a specific distance from the divergent laser emission source;

and a narrow bandwidth, wavelength selective transmission filter of Fabry-Perot structure disposed between the emission source and the pair of photodetectors, the filter being tilted at an angle θ relative to the optical axis of the emission source, whereby the transmission of the filter is wavelength dependent, and centered at a predetermined wavelength of the laser emission source;

means for generating a difference signal from the first and second photodetectors, the difference signal generated by the response of the pair of photodetectors being dependent on a change in wavelength transmitted by the wavelength selective filter, to provide a signal via a feedback loop for controlling the wavelength of the laser emission source.

Because the monitoring assembly is simple and compact, an important advantage is that the assembly may be co-packaged with the laser source in an existing transmitter module, i.e. in a standard laser package. This is particularly useful in adapting existing transmitter modules, as used for single wavelength transmission systems, for use with additional components for WDM without taking up additional space and with minimum disruption of existing systems.

Long term reliability of the assembly is expected to meet lifetime requirements for WDM systems.

DESCRIPTION OF THE EMBODIMENTS

Figure 1:
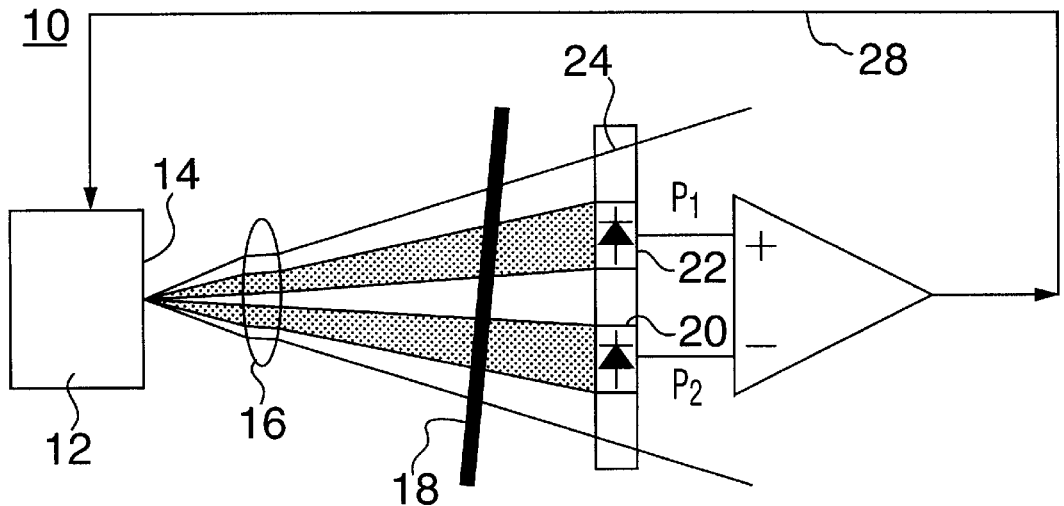
FIG. 1 shows a schematic diagram of part of a wavelength monitoring assembly according to a first embodiment of the present invention.

Part of a wavelength monitoring assembly 10 according to a first embodiment of the present invention is shown in FIG. 1. The assembly comprises a divergent source 12 of laser emission, that is, a semiconductor laser facet 14 of a DFB laser, as shown, or alternatively an output facet of a single mode fibre (SMF). An optional lens 16 provides for controlling the divergence of the output beam of the laser source, which is directed to a narrow bandpass, wavelength selective transmission filter element 18. The latter is preferably a Fabry-Perot (FP) resonator, which is a structure comprising a spacer layer sandwiched between two highly reflecting layers. It is constructed for example as a multi-layer single cavity filter type, where an all-dielectric mirror/spacer/mirror structure is deposited on a glass substrate. Alternatively, a solid etalon type is used, in which mirrors are deposited on both sides of a glass spacer plate.

The transmitted divergent beam is directed onto first and second similar coplanar photodetectors ($P_1$) 20 and ($P_2$) 22 having a specific diameter and separation, which are mounted on a common support 24 at a specific distance from the FP etalon, as shown schematically in FIG. 1.

Since the wavelength of the light source determines how much the beam is transmitted by the FP filter, the signal received at each detector 20 and 22 is dependent on the wavelength emitted from the light source, Thus, through the angular dependence of the wavelength transmission of the Fabry-Perot etalon, a wavelength variation from the source is converted to a transmission change, and the wavelength change is detected as a power change by the two photodetectors. The output signals from the two photodetectors are used to generate a difference signal in subtractor amplifier 26 which is fed to a feedback loop 28 for controlling the output wavelength of the laser source. By arranging that the transmission detected by both detectors is the same at a selected wavelength, the difference signal is set to be zero at the predetermined wavelength, i.e. the locked wavelength. The locked wavelength can be set, with equivalent stability, to different values by using unequal gains for photodetectors $P_1$ and $P_2$. If the source wavelength changes, the differential signal generated by the two detectors, i.e. the error signal, is wavelength dependent and can be used to monitor the wavelength of the light source. The device functions therefore as an optical wavelength discriminator in which the photo-detectors convert optical energy to a current for a feedback loop for controlling the laser source.

Figure 2:
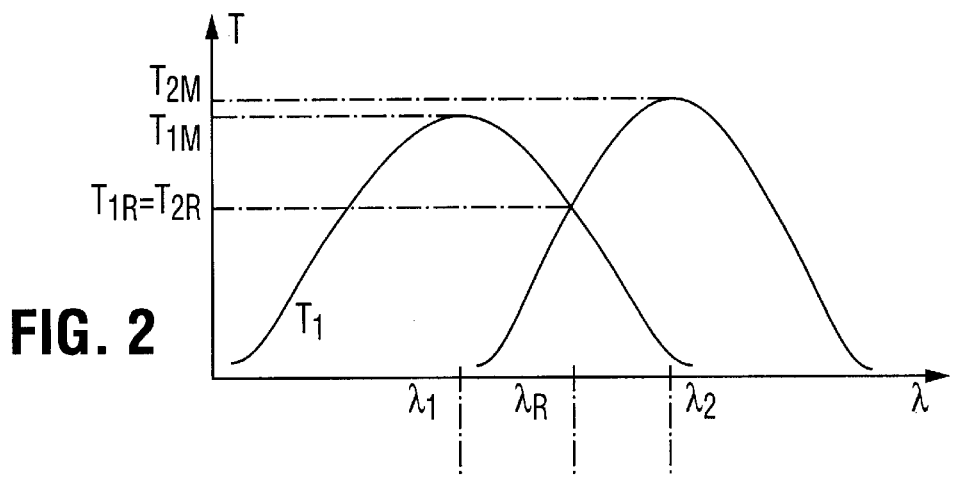
FIG. 2 shows transmission curves of etalon for the signal at two wavelengths.
Figure 3:
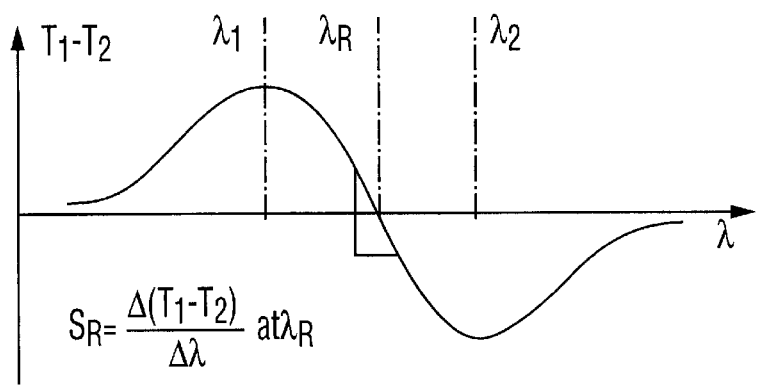
FIG. 3 shows the corresponding difference signal from the first and second photodetectors.

Schematic representations of the transmission curves and difference signal generated by the two detectors are shown respectively in FIGS. 2 and 3. FIG. 2 shows the transmission curves of the two detectors where T is the transmission from source to detectors, where $T_1$ and $T_2$ represent the transmission curves for the individual detectors $P_1$ and $P_2$ which have a maximum transmission at $T_{1M}$ and $T_{2M}$ at $\lambda_1$, and $\lambda_2$. The difference signal from the two detectors is represented in FIG. 3. At the desired locked wavelength, the slope $S_R$ of the difference at the locking point $\lambda_R$ is $$S_R = \frac{\Delta(T_1 - T_2)}{\Delta \lambda}$$

and the near linear region between $\lambda_1$ and $\lambda_2$ defines the useful range of control obtained, for example, by using unequal photodetector gains.

Figure 4:
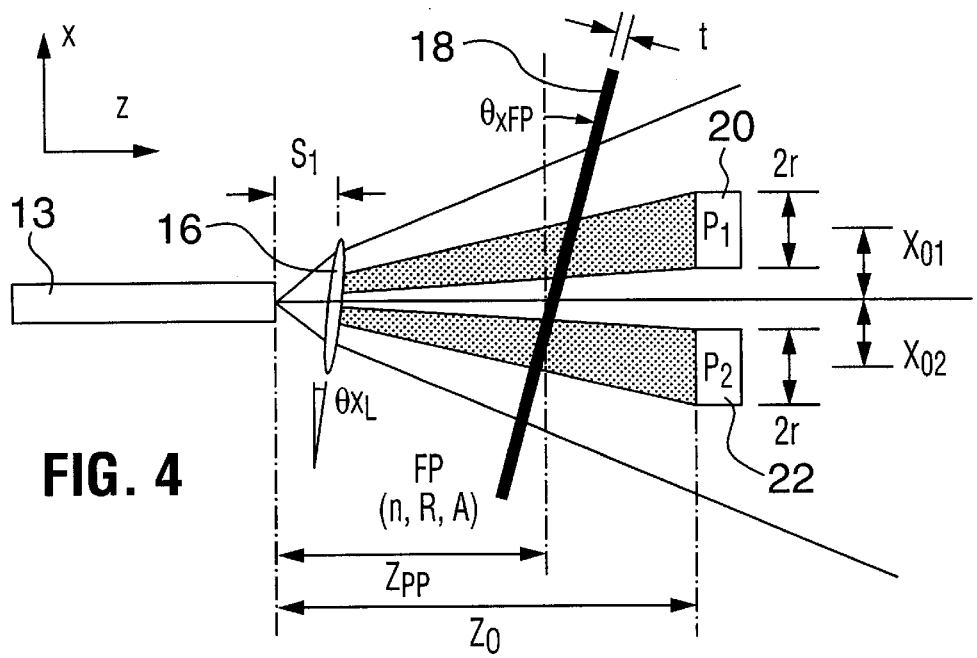
FIG. 4 shows a schematic of part of the assembly similar to that shown in FIG. 1, which defines coordinates and parameters for design of the assembly.

FIG. 4 defines coordinates and a number of relevant configuration parameters for an assembly including a divergent emission source, e.g. single mode fibre, lens, filter and pair of photodetectors. A schematic of an assembly and test set up for wavelength stabilization of a DFB laser, including a control loop, is shown in FIG. 5.

Figure 5:
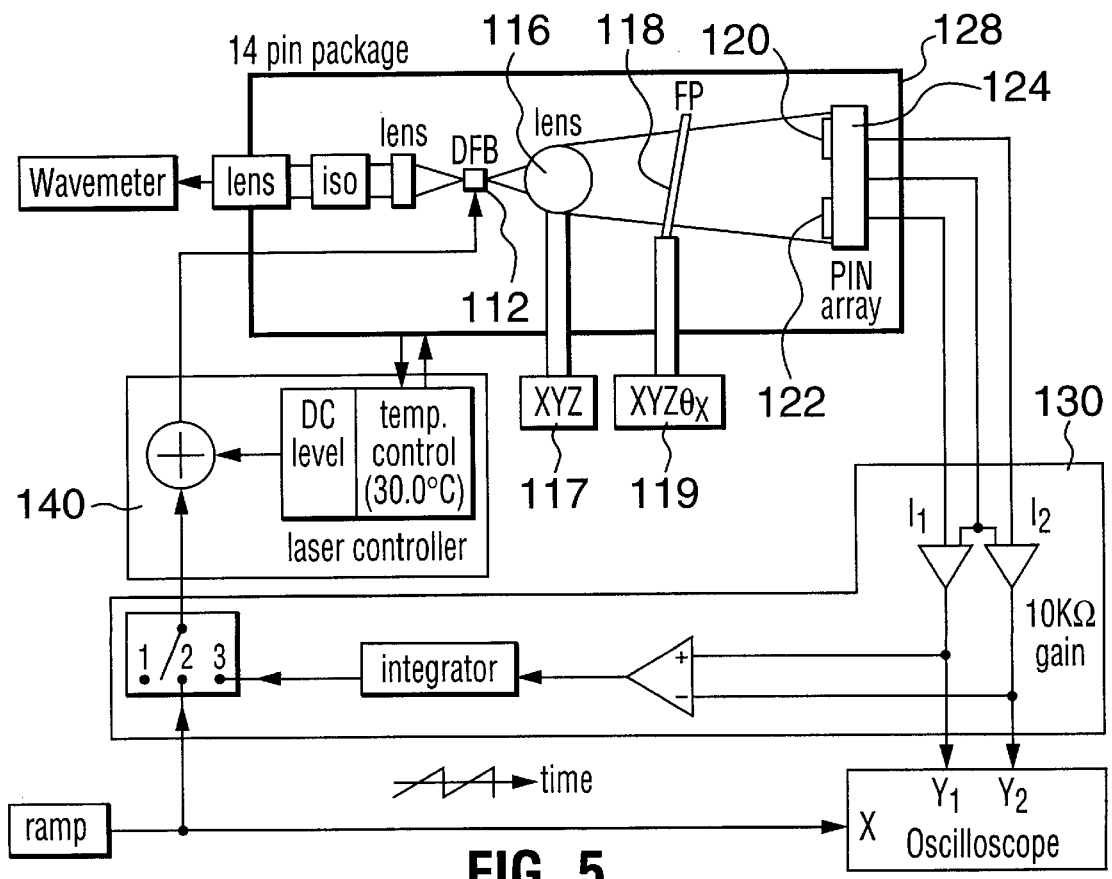
FIG. 5 shows a schematic of the test system for a wavelength stabilization assembly according to a second embodiment of the present invention.

In FIG. 5, the wavelength stabilization assembly comprising a lens 116, FP etalon 118 and pair of PIN diodes 120 and 122 is co-packaged with a DFB laser source 112 within a single package 128 which is a standard 14 pin package. The matched diode pair 120 and 122 are coplanar, and mounted close together on a common support 124. Output signals from the two diodes are fed to a subtractor amplifier 130 to generate a difference signal which is fed back to the laser controller 140 for controlling the output wavelength of the laser. Other components shown in FIG. 5 include test apparatus used in designing optimum configurations for the prototype. Preferably the mounting 117 for the lens 116 and mounting 119 for the FP etalon 118 are adjustable. Changing the tilt angle $\theta_x$ of the FP etalon provides for tuning of the target wavelength as described below.

As shown in FIG. 4, the divergent source 13, has a generally Gaussian pattern, which may be elliptical (laser) or circular (single-mode fibre).

The Fabry-Perot etalon has parameters of thickness t, refractive index n, reflectivity R, internal transmission A, x axis tilt angle $\theta_{xFP}$ which is determined by the choice of FP design and the required $\lambda_R$, and y axis tilt angle $\theta_{yFP}$ which may be arbitrarily chosen to be 0. The two detectors have nominal y axis positions of $y_{01}=0$ and $y_{02}=0$ which are arbitrarily chosen.

Other configuration parameters are chosen in accordance with these parameters and the desired specifications, i.e. the required transmission curves.

These parameters include: the focal length of the lens f, z axis position $S_1$, x axis tilt angle $\theta_{xL}$, y axis tilt angle $\theta_{yL}$, the z axis position of the etalon $Z_{FP}$, and assuming the detectors are circular, the radius r of the photodetectors, their z axis position $z_0$, and x axis positions $x_{01}$ and $x_{02}$.

Each detector has a diameter of $d_1$ and $d_2$ respectively, and the pair of detectors are coplanar, and separated centre to centre by a distance D, located a distance l from the light source, the FP filter is tilted at an angle of $\theta$ from the normal to the plane of the two detectors.

Factors influencing the performance of the assembly include the FP etalon tilt angles in the x and y axis, the FP index change with temperature, the detector x and y axis offset, lens position and tilt, and the detector z axis position. T is the transmission from the source to a detector and includes the coupling loss due to limited detector size.

The desired locked wavelength $\lambda_R$ has a specific target value, e.g. 1557.0 nm. The ratios $T_{1R}/T_{1M}$ and $T_{2R}/T_{2M}$ are specified to be a half, for a first approximation. The slope at the locking point $S_R$ is also of interest because of its impact on the loop gain. A high slope is generally desirable. $\lambda_2-\lambda_1$ expresses the tuning range over which $T_1$ and $T_2$ can be compared. $T_{1M}$ and $T_{2M}$ allow the estimation of absolute power, and therefore S/N for given detector characteristics.

The assembly is wavelength tunable by changing the angle of inclination θ of the filter element, for example, tilt angle $\theta_x$ as shown in FIG. 5, where the filter element, i.e. the etalon, is mounted on an adjustable support with four degrees of freedom, including angular adjustment. In the test set up, the lens was also movable in 3 dimensions. Once the assembly is aligned for a particular target wavelength, the components, including the filter and the lens, are fixed in place using thin layers of adhesive.

Wavelength tunability at the module alignment stage is an advantage over known grating based wavelength control units.

Furthermore, because the transmission of a Fabry-Perot filter is characterized by a series of transmissive peaks at regular wavelengths intervals, for example, at 4 nm spacing, simultaneous stabilization points are attainable for a plurality of predetermined wavelengths which are determined by wavelength spacings of the multiple transmissive peaks characteristic of the Fabry-Perot filter.

Thus, the minimum required components for the wavelength discrimination scheme are a narrow band transmission filter (etalon) and two closely spaced detectors, preferably a matched pair of photodiodes, and a control loop which responds to the difference signal from the pair of photodetectors. A Fabry-Perot etalon is required to provide suitable characteristics of the wavelength selective filter element.

The light source may for example be a front facet of a semiconductor laser, for example a DFB laser, or the cleaved or tapered end of a single mode fibre. If required, the divergence of the emission source is controlled by a lens as shown in FIG. 1, which may be any suitable aspherical lens, a cylindrical lens, a spherical lens, or a graded index lens, of glass or plastic. A larger spot size gives the filter a shape closer to desired, and provides better power transfer to the detectors. Alternatively, the assembly may be provided without a lens if the divergence of the emission source is satisfactory to meet these requirements. Beneficially collimated beams are not required, potentially reducing the number of components and size of the assembly.

In the assembly described above, the compactness and simplicity of the configuration allows for co-packaging with a laser source in a standard laser transmitter package. This is a particular advantage for integration with existing systems. Some of the benefits of the same configuration may be obtained in a unit external to the laser source, but because coupling to an external unit is polarization dependent, couplers or fibers that are polarization maintaining would then be preferred.

Thus a simple and compact wavelength monitoring and control assembly for a laser emission source is provided comprising a narrow bandpass, wavelength selective transmission filter element, for example a Fabry-Perot etalon, through which a non-collimated beam from the laser source is directed onto two closely spaced photodetectors. For wavelength stabilization, the differential output of the two photodetectors generated by the change in transmission of the filter element with a change in wavelength is used in a feedback loop to stabilize the wavelength of the laser source to a desired target wavelength. Optionally, wavelength tunability is provided by changing the angle of inclination of the Fabry-Perot etalon relative to the laser source. The system is compact and may be co-packaged within the same package as a laser emission source, overcoming coupling, space and power dissipation problems common with known external semiconductor laser wavelength control units.

While specific embodiments have been described in detail, it will be understood that variations and modifications of the embodiments may be made within the scope of the following claims.

What is claimed is:

1. A wavelength monitoring and control assembly for an optical system comprising a laser emission source for generating a divergent beam, the assembly comprising:

first and second photodetectors spaced apart by a specific separation, and located at a specific distance from the emission source;

a narrow bandpass wavelength selective transmission filter element of Fabry-Perot structure located between the source and the photodetectors, the filter element being tilted at an angle θ relative to the optical axis of the emission source to provide an angular dependence of the wavelength transmission of the filter, for illuminating the photodetectors with two different parts of the divergent beam, incident at the filter at different angles, and transmitted by the filter, whereby a change in wavelength from the source is converted to a difference in transmission detected by the photodetectors; and a control loop for feedback of a difference signal generated by the first and second photodetectors in response to a change in wavelength of the emission source to control means of the emission source to provide wavelength stabilization of the source.

2. An assembly according to claim 1 comprising a lens disposed between the emission source and the transmission filter element to control divergence of the laser emission source.

3. An assembly according to claim 1 wherein the laser emission source comprises a semiconductor laser provided within a package, and the wavelength monitoring assembly is provided within the same package to provide an integral unit.

4. An assembly according to claim 1 wherein the laser emission source is an output facet of a semiconductor laser.

5. An assembly according to claim 1 wherein the laser emission source comprises a cleaved single mode fibre.

6. An assembly according to claim 1 wherein the laser emission source comprises a tapered single mode fibre.

7. An assembly according to claim 1 wherein the angle θ of inclination of the filter element relative to the emission source is adjustable to provide wavelength tunability.

8. An assembly according to claim 1 wherein the photodetectors are a matched pair of photodiodes.

9. An assembly according to claim 1 wherein the gain of each of the two photodetectors is independently adjustable and a predetermined wavelength is selectable by setting unequal gains for the two photodetectors.

10. An assembly according to claim 1 wherein simultaneous stabilization points are attainable for a plurality of predetermined wavelengths determined by wavelength spacings of the multiple transmissive peaks characteristic of the Fabry-Perot filter.

11. A wavelength monitoring and control assembly for wavelength stabilization of a laser emission source, the assembly comprising:

a package, and integrated within the package:

a laser emission source for generating a divergent beam;

first and second coplanar photodetectors having a specific diameter and separation, and located at a specific distance from the emission source;

and a narrow bandwidth, wavelength selective transmission filter element of Fabry-Perot structure disposed between the emission source and the photodetectors, the filter element being tilted at an angle $\theta$ relative to the optical axis of the emission source to provide an angular dependence of the wavelength transmission of the filter, for illuminating the two photodetectors with two different parts of the divergent beam incident at the filter at different angles and transmitted by the filter, whereby a change in wavelength from the source is converted to a difference in transmission detected by the photodetectors;

means for generating a difference signal from the first and second photodetectors, the difference signal generated by the response of the photodetectors being dependent on a change in wavelength transmission by the wavelength transmission selective filter, to provide a signal via a feedback loop for wavelength stabilization of the laser emission source.

12. The assembly of claim 11 wherein the filter comprises a Fabry-Perot etalon, and the angle $\theta$ of inclination of the etalon to the emission source is adjustable to provide tunability of the predetermined wavelength.

13. The assembly of claim 11 comprising a lens to control the divergence of the laser emission source.

14. An assembly according to claim 11 wherein the laser emission source is an output facet of a semiconductor laser.

15. An assembly according to claim 11 wherein the laser emission source comprises a cleaved single mode fibre.

16. An assembly according to claim 11 wherein the laser emission source comprises a tapered single mode fibre.

17. An assembly according to claim 11 wherein the photodetectors are a matched pair of photodiodes.

18. An assembly according to claim 11 wherein the gain of each of the two photodetectors is independently adjustable and the predetermined wavelength is selectable by setting unequal gains for the two photodetectors.

19. An assembly according to claim 11 wherein simultaneous stabilization points are attainable for a plurality of predetermined wavelengths determined by wavelength spacings of the multiple transmissive peaks characteristic of the Fabry-Perot filter.

* * * * *